United States Patent
Sanda et al.

(10) Patent No.: US 9,892,992 B2
(45) Date of Patent: Feb. 13, 2018

(54) SWAGED HEAT SINK AND HEAT SINK INTEGRATED POWER MODULE

(71) Applicant: MITSUBISHI ELECTRIC CORPORATION, Chiyoda-ku (JP)

(72) Inventors: Yasuyuki Sanda, Chiyoda-ku (JP); Dai Nakajima, Chiyoda-ku (JP); Hiroyuki Yoshihara, Chiyoda-ku (JP); Kiyofumi Kitai, Chiyoda-ku (JP); Kiyoshi Shibata, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/024,953

(22) PCT Filed: Sep. 19, 2014

(86) PCT No.: PCT/JP2014/074809
§ 371 (c)(1),
(2) Date: Mar. 25, 2016

(87) PCT Pub. No.: WO2015/046040
PCT Pub. Date: Apr. 2, 2015

(65) Prior Publication Data
US 2016/0225691 A1 Aug. 4, 2016

(30) Foreign Application Priority Data
Sep. 27, 2013 (JP) .................................. 2013-200820

(51) Int. Cl.
*H01L 23/34* (2006.01)
*H01L 23/367* (2006.01)
(Continued)

(52) U.S. Cl.
CPC ...... *H01L 23/3672* (2013.01); *H01L 21/4882* (2013.01); *H01L 23/36* (2013.01);
(Continued)

(58) Field of Classification Search
CPC ............. H01L 23/3672; H01L 23/3107; H01L 23/3675; H01L 21/4882; H01L 23/3121;
(Continued)

(56) References Cited

U.S. PATENT DOCUMENTS 8,643,171 B1 * 2/2014 Nakazato ................ H01L 23/34
165/80.3
2002/0048147 A1 1/2002 Pham et al.
2012/0227952 A1 9/2012 Yoshihara et al.

FOREIGN PATENT DOCUMENTS

JP 07-193383 A 7/1995
JP 2002-134973 A 5/2002
(Continued)

OTHER PUBLICATIONS

International Search Report (PCT/ISA/210) dated Nov. 27, 2014, by the Japanese Patent Office as the International Searching Authority for International Application No. PCT/JP2014/074809.
(Continued)

*Primary Examiner* — Julio J Maldonado
*Assistant Examiner* — Stanetta Isaac
(74) *Attorney, Agent, or Firm* — Buchanan Ingersoll & Rooney PC

(57) ABSTRACT

A swaged heat includes a fin base having an outer periphery, and formed with a first fin insert groove and a second fin insert groove interposing a swage portion of a bi-forked shape in between, a first fin fixed to the first fin insert groove of the fin base using the swage portion, a second fin fixed to the second fin insert groove of the fin base using the swage portion, a panel having an opening portion, and placed on
(Continued)

the outer periphery of the fin base. The thickness of the outer periphery is smaller than that of the fin base.

20 Claims, 11 Drawing Sheets

(51) Int. Cl.
*H01L 23/36* (2006.01)
*H01L 21/48* (2006.01)
*H01L 25/07* (2006.01)
*H01L 25/18* (2006.01)
H01L 23/31 (2006.01)
H01L 23/373 (2006.01)
H01L 23/498 (2006.01)

(52) U.S. Cl.
CPC ...... *H01L 23/3675* (2013.01); *H01L 23/3677* (2013.01); *H01L 25/07* (2013.01); *H01L 25/18* (2013.01); *H01L 23/3107* (2013.01); *H01L 23/3121* (2013.01); *H01L 23/3735* (2013.01); *H01L 23/49861* (2013.01); *H01L 2224/32245* (2013.01)

(58) Field of Classification Search
CPC ..... H01L 23/3677; H01L 23/36; H01L 25/07; H01L 25/18; H01L 2224/32245; H01L 23/3735; H01L 23/49861; H01L 23/00; H01L 23/03

See application file for complete search history.

(56) References Cited

FOREIGN PATENT DOCUMENTS

| | | |
|---|---|---|
| JP | 2002-270736 A | 9/2002 |
| JP | 2009-033065 A | 2/2009 |
| JP | 2009-081157 A | 4/2009 |
| JP | 2009-218396 A | 9/2009 |
| JP | 2012-049167 A | 3/2012 |
| JP | 5236127 B1 | 7/2013 |
| WO | WO 2011/061779 A1 | 5/2011 |

OTHER PUBLICATIONS

Written Opinion (PCT/ISA/237) dated Nov. 27, 2014, by the Japanese Patent Office as the International Searching Authority for International Application No. PCT/JP2014/074809.

* cited by examiner

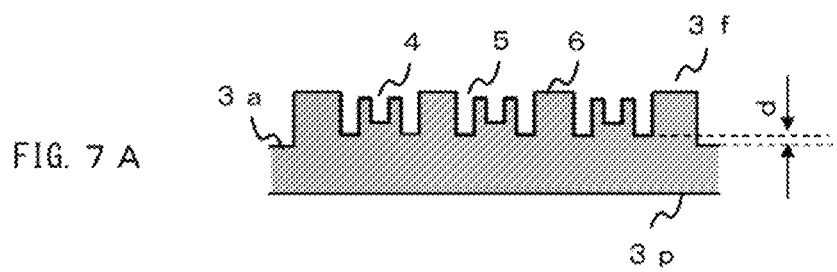
FIG. 7A
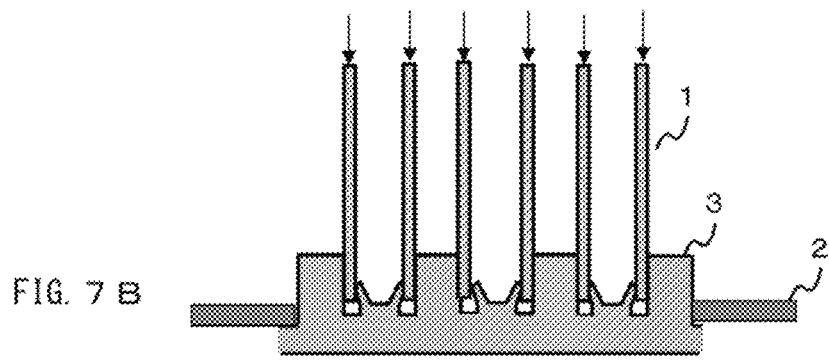
FIG. 7B
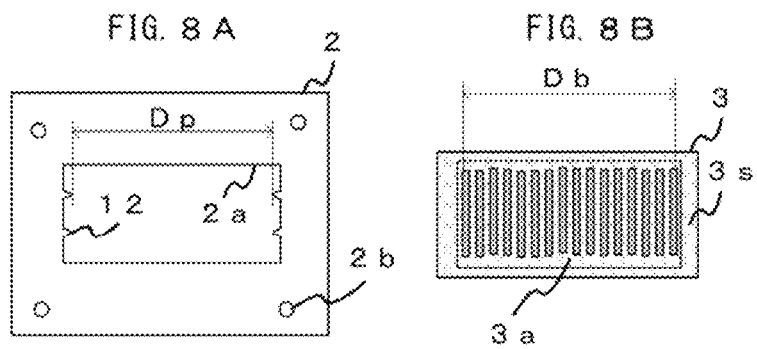
FIG. 8A   FIG. 8B
FIG. 8C

FIG. 11A
FIG. 11B
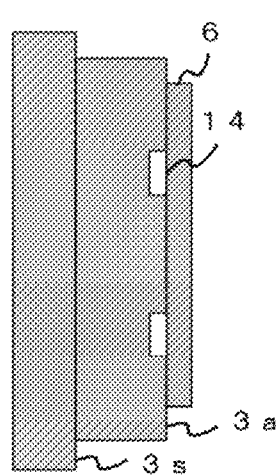
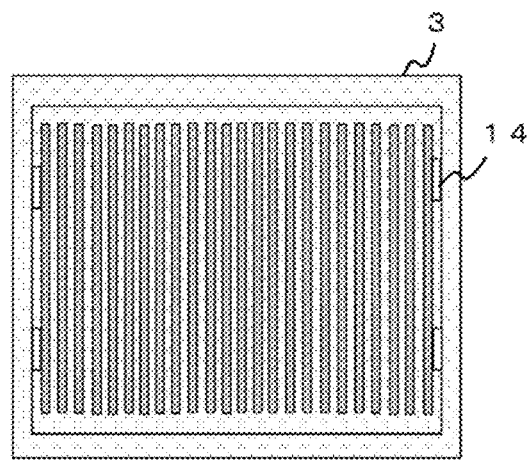
FIG. 12A
FIG. 12B
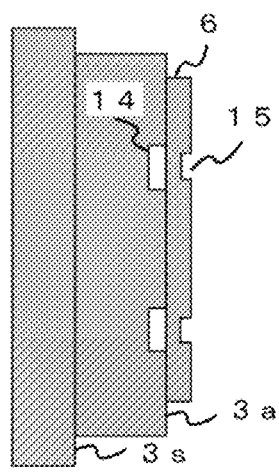
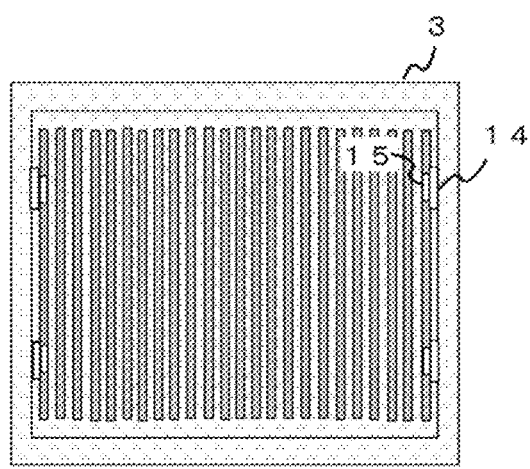

SWAGED HEAT SINK AND HEAT SINK INTEGRATED POWER MODULE

TECHNICAL FIELD

This invention relates to a swaged heat sink, and more particularly to a structure of the swaged heat sink that is utilized with a power module for integration.

BACKGROUND ART

Heat sinks with a swaged structure are widely adopted as radiators in electronic devices having power semiconductor elements (heating portions) such as LSIs (Large Scale Integrations), diodes and others (see Patent Documents 1, 4 and 5, for example). The heat sink with a swaged structure releases heat from a heating portion by heat conduction (or heat transfer). As for a heat sink with a swaged structure, a plurality of fins are inserted into fin insert grooves formed on a plain face of a fin base. The fin base and the plurality of fins are integrated by swaging a swage portion of the fin base to induce plastic deformation of the fin base.

As for a heat sink integrated power module, known is a fin integrated power module, in which a corrugated heat sink is fitted for integration into irregular base bottom surfaces of a resin sealed type power module (see Patent Document 2, for example). Emission noises released from the heat sink can be lowered by connecting heat dissipating fins to a ground potential (see Patent Document 3, for example).

PRIOR ART REFERENCE

Patent Documents

Patent Document 1: Japanese Laid-Open Patent Application No. 7-193
Patent Document 2: Japanese Laid-Open Patent Application No. 2009-33,065
Patent Document 3: Japanese Laid-Open Patent Application No. 2012-049167
Patent Document 4: Japanese Laid-Open Patent Application No. 2002-134
Patent Document 5: PCT Patent Application No. WO 2011/061779

SUMMARY OF THE INVENTION

Problems to be Solved by the Invention

As for the heat sink with a swaged structure of Patent Document 1, different members like a fin base and fins are integrated by swaging operation. One feature of the swage heat sink is that the length of the fin tends to be longer than that of the fin base in a ventilation direction. When such a swaged heat sink is made, the fin base and fins are not enough to ensure a ventilation path and heat dissipation performance becomes insufficient.

In such a structure as to radiate heat of a heating member like a power semiconductor element from a swaged heat sink by way of grease, a screw hole is machined at the fin base side of the swaged heat sink. This machining process induces a higher cost for a power module and the fin base grows in size to secure a space for screw hole machining. The screw hole machined on a grease face of the fin base reduces heat dissipation performance of the heat sink.

The present invention has been implemented to resolve problems above mentioned and aims at manufacturing a swaged heat sink that secures a ventilation path enough for high heat dissipation performance and is easy to fix with a heating portion, and also at providing a heat sink integrated power module equipped with the swaged heat sink.

Means for Solving the Problem

A swaged heat sink according to the present invention includes a fin base having an outer periphery, and formed with a first fin insert groove and a second fin insert groove interposing a swage portion of a bi-forked shape in between, a first fin fixed to the first fin insert groove of the fin base using the swage portion, a second fin fixed to the second fin insert groove of the fin base using the swage portion, a panel having an opening portion, and placed on the outer periphery of the fin base. The thickness of the outer periphery is smaller than that of the fin base.

Advantages of the Invention

According to the present invention, a swaged heat sink can secure a ventilation path and obtain enough heat dissipation performance, by making the swaged heat sink with interposing a panel into a fin base. Furthermore, the fin base and panel are fixed with enough strength, because the fin base and panel are integrated by swaging operation (or press fitting), using a protruding portion provided on the panel.

BRIEF DESCRIPTION OF THE DRAWINGS

FIGS. 7A and 7B are sectional views representing a relation of a fin base and fins.

FIGS. 8A to 8C are schematic views of a swaged heat sink according to Embodiment 3 of the present invention, for illustrating roles of protruding portions formed on a panel.

FIGS. 11A and 11B are a side and a plane views to represent the structure of swarf clearance grooves formed on a fin base, in accordance with a swage heat sink of Embodiment 4 of the present invention.

FIGS. 12A and 12B are a side and a plane views to represent the structure of panel guide grooves formed on a fin base, in accordance with a swage heat sink of Embodiment 4 of the present invention.

EMBODIMENTS FOR CARRYING OUT THE INVENTION

Hereinafter, embodiments of swaged heat sinks and heat sink integrated power modules according to the present invention will be described in detail with reference to the drawings. Note that the present invention is not limited to the description below and can be properly modified without departing from the scope and spirits of the present invention.

Embodiment 1

Figure 1:
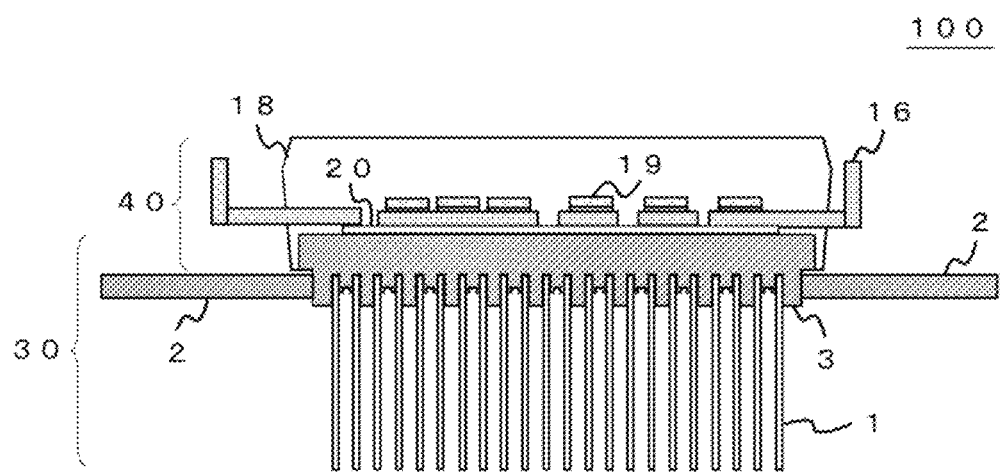
FIG. 1 is a sectional view showing a whole constitution of a heat sink integrated power module, according to Embodiment 1 of the present invention.

FIG. 1 shows a heat sink integrated power module 100 according to Embodiment 1 of the present invention. The heat sink integrated power module 100 includes a swaged heat sink 30 and a power module portion 40. The swaged heat sink 30 is made up of a plurality of fins 1, a panel (an intermediate member) 2 and a fin base 3. A power semiconductor element (chip) 19 is mounted on a lead frame 16, and joined to the lead frame 16 with solders and/or the like. The lead frame 16 is adhered on the fin base 3, with an insulation sheet 20 in between.

The power module portion, the panel and the fins are integrated together to form a heat sink integrated power module 100. The power module portion 40 is transfer molded, embedding the fin base on a heat dissipation side of the power module portion. The panel 2 is interposed and fins 1 are swaging operated later for fixing. In order to interpose the panel 2 in the fin base, the panel 2 is press fitted into the fin base 3 and is placed on the outer periphery (see FIG. 3). A mold resin (body) 18 of the power module portion 40, if it is constructed by transfer molding, saves the power semiconductor element from the destruction by a local action of swaging load to the element. More specifically, a unified structure of the mold resin 18 prevents extreme stress concentration and relaxes stresses. Therefore, the heat sink integrated power module 100 secures reliability, by having a unified structure of mold resins such as an epoxy resin and similar hard resins.

Conventional heat sink integrated power modules secure a heat dissipation path, by creating a thermal connection with thermal conductive grease between a finished flat bottom surface of the power module and a finished flat surface of the heat sink. In general, the thermal conductive grease includes fillers and resin. Application of the thermal conductive grease does not comprise a major obstacle to the module. However, bleeding of the grease to separate into fillers and resin increases thermal contact resistance of a thermal conductive grease portion. Further, the camber of a bottom surface of the power module varies with the change of the power module in temperature, and a separation between the bottom surface of the power module and the bottom surface of the heat sink changes. The power module may be exposed to a phenomenon known as dry out where the thermal conductive grease is pushed out. In this case, the thermal contact resistance increases again.

As for the semiconductor elements 19, a semiconductor element that is formed of a wide bandgap semiconductor having a wider band gap than silicon can be preferably used, in addition to that formed of silicon. The wide bandgap semiconductor is formed of, for example, silicon carbide (SiC), a gallium-nitride-based material, or diamond. Employing such a wide bandgap semiconductor for a power semiconductor element can make compact a device that uses the element because its allowable current density is high and its power loss is low.

Figure 2:
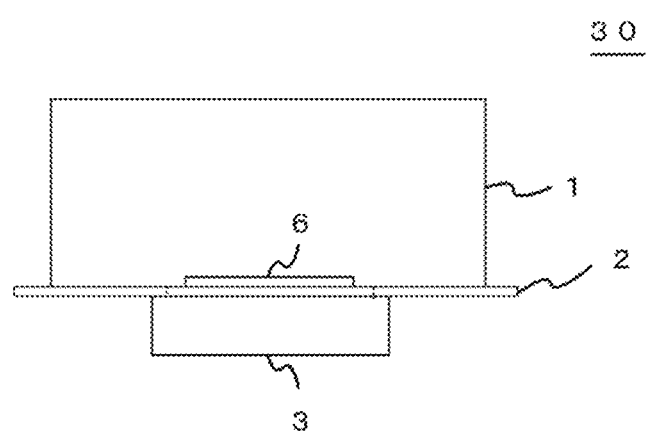
FIG. 2 is an assembly drawing showing a whole constitution of a swaged heat sink, according to Embodiment 1 of the present invention.

FIG. 2 shows an assembled configuration of another swaged heat sink according to Embodiment 1 of the present invention. The swaged heat sink 30 includes a plurality of fins 1, a panel 2 and a fin base 3. A convex wall portion 6 is formed on a fin side of the fin base 3. A plurality of fins 1 are supported by the convex wall portion 6 of the fin base 3. As for the heat sink integrated power module, unlike a module by a method of attaching corrugate fins to a fin base, the fin 1 is swaging operated later to the fin base 3 that is already integrated with the power module portion. Because the fin 1 of a flat board can contact the convex wall portion 6 of the fin base 3 closely to the utmost extent, the heat sink integrated power module is adequately low in thermal contact resistance and high in heat dissipation performance.

Figure 3:
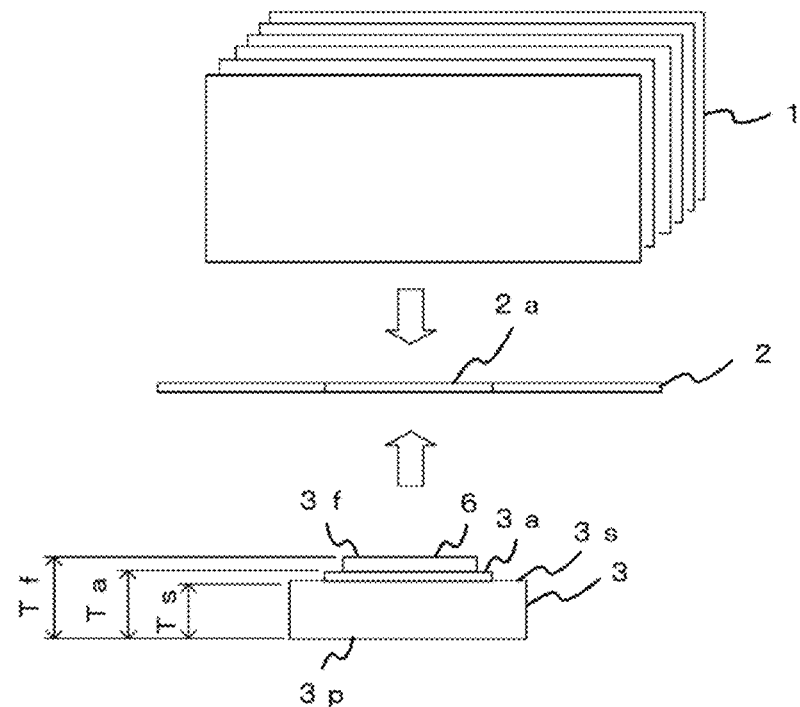
FIG. 3 is a part drawing showing component pieces of a swaged heat sink, according to Embodiment 1 of the present invention.

FIG. 3 shows a part drawing of the swaged heat sink according to the present invention, for illustrating a state of component pieces before assembling. An opening 2a with a larger size (width) than the convex wall portion 6 of the fin base 3 is formed to the panel 2. The panel 2 is put on the outer periphery 3a (a first outer periphery) of the fin base 3 and supported. The fin 1, the panel 2 and the fin base 3 are swaging operated to be unified, after assembled together. An outer periphery 3s of the fin base 3 is needed at an integration step with molding resin. A positioning pin is used at this mold step. The outer periphery 3a is disposed at an inner peripheral side of the fin base than the outer periphery 3s (a second outer periphery). The thickness of the outer periphery 3a is larger than the thickness of the outer periphery 3s, but is smaller than the thickness of the convex wall portion 6. Thicknesses are defined as a length from a power module installation face 3p. The fin 1 is attached to a fin side face 3f of the fin base. However, because the outer periphery 3s is not essential, the outer periphery 3a and the outer periphery 3s may be unified, as shown in FIG. 1. The thickness of the outer periphery 3a (Ta) and the thickness of the outer periphery 3s (Ts) are smaller than the thickness of the fin base (Tf).

FIG. 4 (FIG. 4A to FIG. 4D) show assembling steps of the swaged heat sink. An outer periphery 3a, a swage portion 4, a fin insert groove 5 and a convex wall portion 6 are formed in the fin base 3, as shown in FIG. 4A. The swage portions 4 and the convex wall portions 6 are arranged alternately. The swage portion 4 having a bi-forked shape deforms plastically by press load at the point of swaging operation. Two insert grooves (a first fin insert groove 5a and a second fin insert groove 5b) are formed between the convex wall portions 6, the portions facing each other. The fin 1 is inserted into the fin insert groove 5. The outer periphery 3a is provided at a circumference of the fin base 3 to make the panel 2 interposed between convex wall portions 6. The thickness of the outer periphery 3a is smaller than thicknesses of the swage portion 4 and the convex wall portion 6.

Figure 4A:
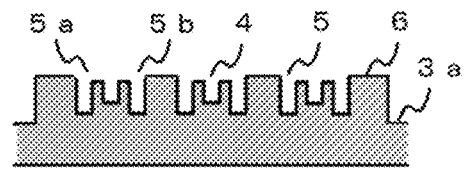
FIGS. 4A to 4D are process drawings showing steps of swaging operation for a swaged heat sink.
Figure 4B:
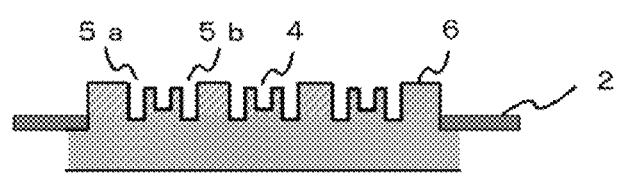
Figure 4C:
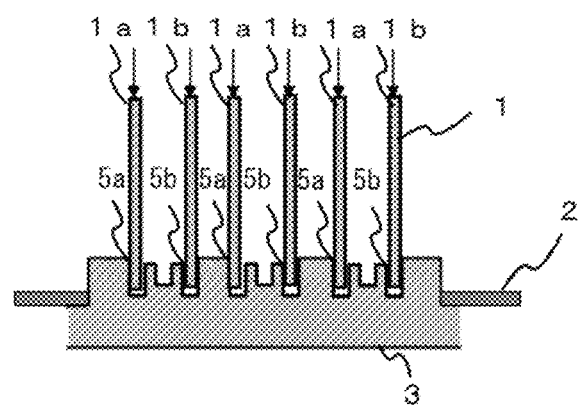
Figure 4D:
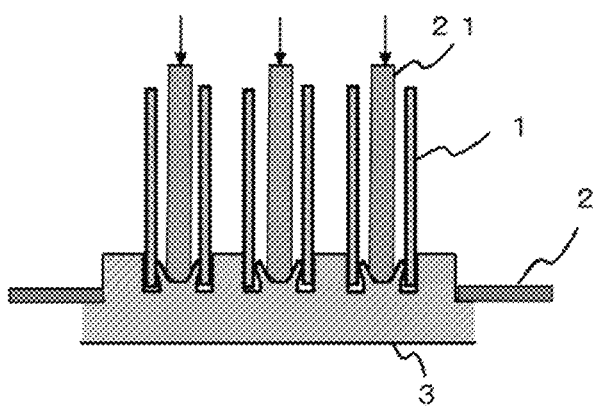

At first, as shown in FIG. 4B, the panel 2 having an opening 2a is interposed in the outer periphery 3a. Then, as shown in FIG. 4C, a plurality of fins 1 are inserted into the fin insert grooves 5. The plurality of fins are kept interposed on the fin base 3. More specifically, a first fin 1a is inserted into the first fin insert groove 5a and a second fin 1b is inserted into the second fin insert groove 5b. The convex wall portion 6 comes in contact with fins 1. Furthermore, as shown in FIG. 4D, a jig 21 is inserted between fins. While the swage portion 4 deforms plastically, the fins 1 are swage fixed to the fin base 3. The swage portion 4 deforms plastically to a fin side and the fin 1 touches the convex wall portions 6 of the fin base 3 from their both sides. In his way, the swaging operation integrates the fin base 3 and the fin 1.

Figure 5A:
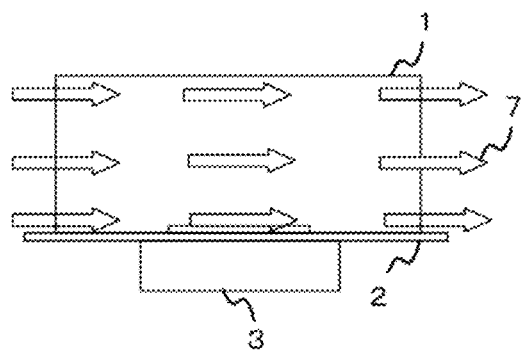
FIGS. 5A and 5B are schematic views, for illustrating effects of a panel on the ventilation path.
Figure 5B:
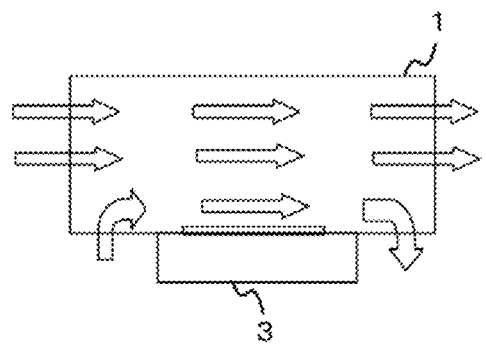

Effects of the panel 2 are described using FIG. 5 (FIG. 5A and FIG. 5B). Among figures, white arrows represent flow velocity vectors 7. If the length of the fin in the ventilation direction is longer than that of fin base, the fin integrated power module fails to make a ventilation path with high heat dissipation performance. When the panel 2 is interposed between the fin base 3 and the fin 1 and integrated with each other, as shown in FIG. 5A, a linear ventilation path can be formed in a ventilation direction, even if the length of the fin in the ventilation direction is longer than that of fin base. In contrast, as shown in FIG. 5B, ventilation paths directing upward or downward from the fin base 3 are formed, in the case of a swaged heat sink which has no panel. Because swaged heat sinks according to the present invention utilize a ventilation path to a full extent, flow velocity among fins does not decrease and heat dissipation performance is improved.

The fin base 3 and panel 2, and the fin base 3 and fin 1, are in contact with each other and unified. Because the panel 2 can work as a heat dissipation path by the heat conduction in each contacting portion, heat dissipation performance is improved. As for the fin 1, selection of aluminum or aluminum alloy boards as the fin materials, machining performance and heat dissipating performance are secured at the same time. Also, the fin base 3 is processed by machining, die-casting, forging or extrusion, and formed with aluminum or aluminum alloy as the material. However, the fin 1 and the fin base 3 are not limited to of aluminum material, and each of the fin 1 and the fin base 3 may be made of different combined materials. For example, a fin made from a copper based board further improves heat dissipation property than that made from aluminum.

As for the swaged heat sink according to the present invention, the thickness of the fin 1 can be set at 0.6 mm-1.0 mm, the width of the fin insert groove 5 at 0.8 mm-1.2 mm and the pitch of the fin 1 at 3 mm-5 mm. The panel 2 forms a ventilation path for heat dissipation. The swaged heat sink was improved in heat dissipation performance, by utilizing even a fin 1 of the length around 2 times of the fin base 3, along a ventilation direction. Because the swaged heat sinks according to the present invention are much flexible in length of the fin, and free in designing the fin base size, fin bases with smaller sizes were implemented.

Note that, numerical values described above are examples and not particularly limited to these values and can be designed freely. The fin base and fins were integrated at a low press load, by applying a structure where the fins were pressed firmly against a convex wall portion of the fin base from both sides of the portion. A convex wall portion 6 of the fin base has a surface roughness (Ra) of ca. 0.5 μm. The thermal contact resistance was reduced by the extremely high smoothness of the fin base. The surface roughness of 0.1 μm or less was feasible for fins of rolled materials without a special increase in cost. Smaller surface roughness improves heat dissipation performance.

Heat sink integrated power modules, according to the present Embodiment, are high in heat dissipating performance, because a panel 2 is provided to secure a ventilation path, regardless of the fin length and fin base length. Furthermore, the panel segregates a cooling wind from the ventilation path and a power module. A variety of electrodes of the power module are shielded to shut out the direct breeze of the wind. By the way, insulation distances for preventing insulating deterioration by dwelling motes and dusts are ranked according to a pollution level. Higher pollution level requires a larger distance. According to the present, the electrodes of the power module are shaded from the cooling wind to contact. The power module can accept a lower pollution level and decrease in size.

Embodiment 2

Figure 6A:
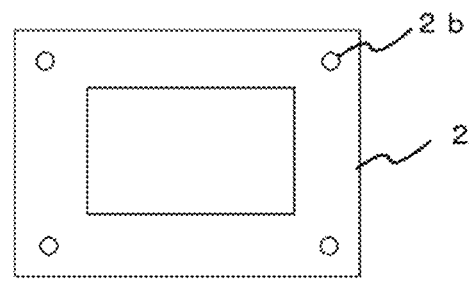
FIGS. 6A to 6C are schematic views of a swaged heat sink according to Embodiment 2 of the present invention, for illustrating effects of vent holes provided on a panel.
Figure 6B:
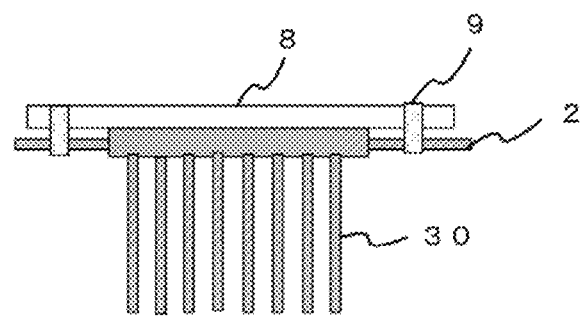
Figure 6C:
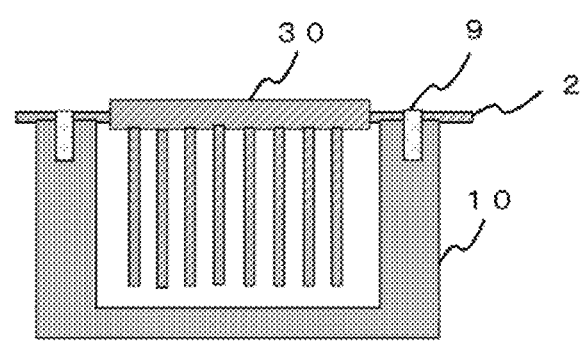

Fin integrated power modules have some points to be fixed. The fin integrated power modules fail to have a structure (or a function) at a power module side for fixing to structural members. A high speed switching device is not accepted to prevent malfunction of a semiconductor element and a control circuit, when a fin is larger than a fin base in length and the fins emit radiation noises. The constitution of the swaged heat sink according to Embodiment 2 is described below based on FIG. 6 (FIG. 6A to FIG. 6C). The panel 2 according to Embodiment 2, as shown in FIG. 6A, is formed of vent holes 2b at the four corners. The vent holes 2b, as shown in FIG. 6B, make it possible to fix, with a screw 9, a swaged heat sink 30 to the heating portion 8 like a power module 40. Also, a fastening member 10 and the heat sink 30, as shown in FIG. 6C, can be fixed with the screw 9.

The panels 2 are manufactured by a die for press forging. Vent holes 2b are manufactured with no additional processing costs. The vibration resistance was improved, by manufacturing vent holes 2b to the panel 2 and fixing the heating portion 8 or the fastening member 10 to the swaged heat sink. It should be noted that, the vent holes provided on the panel were available for positioning of the panel and for deciding the direction of the panel, at the time of manufacturing the swaged heat sink.

The panel 2 according to Embodiment 2 work as a structure for fixing the manufactured swaged heat sink 30 with a heating portion 8 and a fastening portion 10. It is desirable to construct the panel 2 with a metal that has enough strength such as zinc galvanized sheet steel and stainless steel. However, the panel 2 is not necessarily metal and may be resin system materials. When resin system materials are used for the panel 2, it is necessary to make a conductivity of the panel 2 high enough from the viewpoint of electric noises.

It is preferable that the thickness of the panel 2 is set larger than a thickness difference d between the outer periphery 3a and the fin insert groove 5 (cf. FIG. 7A). At the point of the swaging operation, the fin is pushed firmly to the panel direction, as shown in FIG. 7B, from the fin side face 3f, opposing to or facing the power module installation face 3p. With keeping the fin base 3 in contact with the panel 2, a swaging operation is performed. The panel 2 can be integrated with the fin base 3 and the fin 1. An adequate strength is secured for both contacts between the fin 1 and the panel 2 and between the panel 2 and the fin base 3. A swaged heat sink can be fixed with a heating portion 8 or a fastening member 10, through the panel 2, with improved strength and vibration resistance, after the integration of the fin 1, the panel 2 and the fin base 3 is accomplished.

Providing vent holes 2b not only improves the strength and vibration resistance but also reduces the electrical resistance between the panel and the fin, because increased contact faces make many electrical contact points. Usually, a grounding metal is attached to a panel and constitutes a grounding terminal, so that a heat sink is grounded electrically. The grounding metal fixes a terminal for screw fixing an earth line to the heat sink via a metal conductor. Some grounding metal fittings are attached to screw holes of the heat sink, and others are attached to a heat sink integrated panel.

The swaged heat sink is one type of heat sink basically composed of a fin, a fin base and a panel. Grounding metals provided on a panel eliminate screw fixing portion on a fin base. The fin bases are constructed in a minimal volume and a whole body is down sized. Generally, heat sinks include a ground terminal and are connected to the ground potential using the ground terminal. If a heat sink is high in impedance with the ground, the heat sink behaves like an antenna and disturbs space electric potential. In the present invention, the electrical resistances among a fin base, a fin and a panel were reduced. As a result, noise resistance is improved and large tolerance to the noise is guaranteed.

Furthermore, heat dissipation performance is improved, because the fin base and the panel are put firmly in contact with each other and heat transfer is secured through conduction between them. Also, vent holes are provided on a panel as a structure for fixing to the heat sink integrated power module. The vent holes make it easy to fix fixing members with a heat sink integrated power module manufactured.

Embodiment 3

FIGS. 8A to 8C show a swaged heat sink in accordance with Embodiment 3 of the present invention. As shown in FIG. 8A, at least one protruding portion 12 is provided on a shorter side and/or a longer side of the panel 2 in accordance with the Embodiment. Spacing Dp denotes a distance of the protruding portions, facing each other in a longer side direction. FIG. 8B represents a fin base 3. Spacing Db denotes a distance of the convex wall portions 6 which are separated far most. The protruding portions 12 of the panel 2 are produced to satisfy Spacing Dp<Spacing Db. As shown in FIG. 8C, the protruding portion 12 is swaging operated (or press fitted) to the fin base 3 and a panel 2 with protruding portions are fixed with a fin base. Using a panel 2 with protruding portions, swaging operation jobs are done for the fin base 3 and the panel 2. The fin base 3 and the panel 3 are fixed sufficiently and, further, the fin 1 is swaging operated to the fin base 3. The swaged heat sink after the operation is a heat sink of adequate vibration resistance.

The fin base and the panel are formed usually by machining, like punch pressing, die casting and cutting. There must be a clearance between a fin base and a panel to save assembling failure. A heat sink needs a dimension tolerance anticipation clearance. The clearance of around 0.1 mm must be secured to a minimum. In contrast, at least a margin of plus or minus 0.1 mm is necessary for dimension tolerance. As a result, there is a gap of around 0.2 mm between a fin base and a panel. When such a gap exists, the panel 2 is held to the fin base 3 with a horizontally extending gap.

The panel is put on the outer periphery 3a (the first outer periphery). The outer periphery 3a is disposed inner than the outer periphery 3s (the second outer periphery). The thickness of the outer periphery 3a is larger than the thickness of the outer periphery 3s, but smaller than the thickness of swage portion 4. According to the present Embodiment, protruding portions 12 of a panel have a dimension fit for making some inroads to the fin base by plastic deformation. The swaged heat sink after the operation stands with no spacing and with improved vibration resistance. Furthermore, the fin base and the panel are in very firm contact with each other. The thermal contact resistance between the fin base and the panel is reduced, and the heat dissipation performance of the swaged heat sink is improved.

The panel and the fin base are swaging operated by protruding portions 12 of the panel, and then electrical contact points are created stably. As for the electrical resistance of the swaged heat sink after the operation, electrical resistance values of panels to fins are constantly reduced to the resistance level of members. Before and after the vibration tests and thermal cycle tests are performed, providing protruding portions on a panel reduced variations of electrical resistances to some percentages. Further, providing protruding portions on a panel can keep the heat sink in high rigidity and constructs a structure with enough vibration resistance, even after the heat sink was fixed to the fixing members through the vent holes of the panel.

Figure 9A:
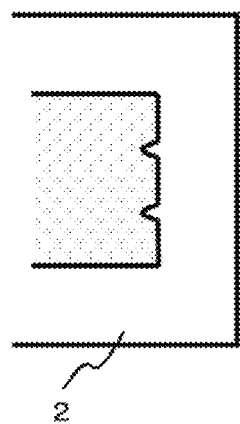
FIGS. 9A to 9C are schematic views representing variations of a convex wall portion formed on a panel.
Figure 9B:
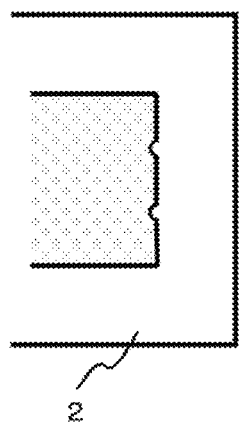
Figure 9C:
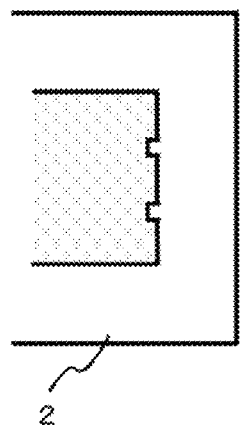

A complimentary description is made to the shape of protruding portions 12 of the panel using FIG. 9 (FIG. 9A to FIG. 9C). Protruding portions 12 may have an acute angle shape (FIG. 9A), an R shape (FIG. 9B) and a square shape (FIG. 9C). All the shapes are acceptable. In experiments with a R shape and an acute angle shape, fin bases and panels are integrated with a low press load at the point of swaging operated. In other words, fin bases were deformed plastically to reduce highly electric resistances. Mere contact is not enough to decrease contact resistance. The deformation decreased the resistances to the level of an ohmic contact. A panel of metal material enhances the suppression of radiation noises. When external size of the panels was set equal to or larger than that of a fin, emission noises were highly suppressed.

Embodiment 4

Figure 10:
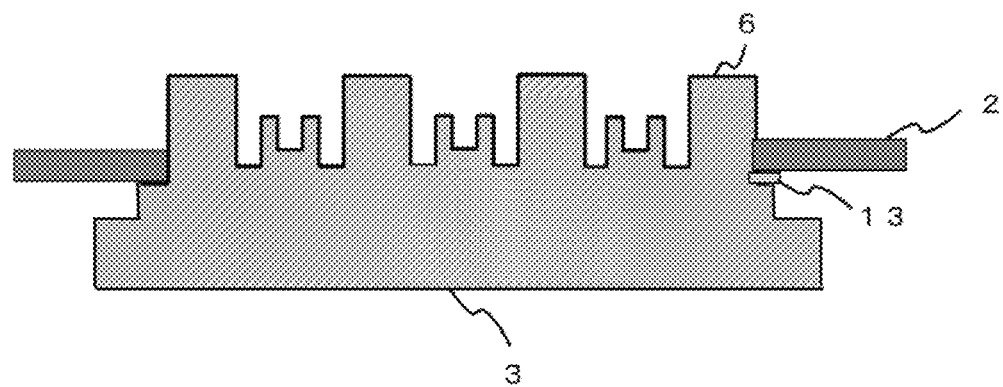
FIG. 10 is a sectional view representing a configuration of a panel inserted into a fin base.

Panels 2 are often formed of materials which are harder than those of fin bases 3. When a fin base and a panel with protruding portions are swaging operated, the protruding portions of the panel scrape a fin base. After the swaging operation is performed, a fin base and a panel with protruding portions are fixed. Therefore, as shown in FIG. 10, cutting debris 13, such as aluminum waste scraped by the protruding portions of the panel, are produced. It is probable that a panel is fixed to the fin base with inclination. When a panel is fixed to a fin base with inclination, the contact area of the fin 1 and convex wall portion 6 is reduced, at a side where a panel is floated when the fins and fin base are swaging operated. Fin strength after the swaging operation may decrease.

Thus, a swarf clearance groove 14 is preformed, as shown in FIG. 11 (FIG. 11A, FIG. 11B), on the fin base 3 according to the Embodiment of the present invention. The swarf clearance groove 14 formed in the outer periphery 3a of the fin base 3 is provided in the lower part of the fin base which is scraped by the protruding portions of the panel. According to the fin base of the Embodiment, the protruding portions prevented a panel from being fixed with floating constantly, when a panel and a fin base were swaging operated.

Furthermore, as shown in FIG. 12 (FIG. 12A, FIG. 12B), in addition to the above mentioned swarf clearance groove 14, a panel guide groove 15 is provided at a portion of the fin base scraped by the protruding portions of a panel. The panel and the fin base are swaging operated (press fitted) with a higher productivity. The panel guide groove 15 formed at the convex wall portion 6 of the fin base is set in length shorter than the length of a protruding portion 12 of the panel.

Figure 13:
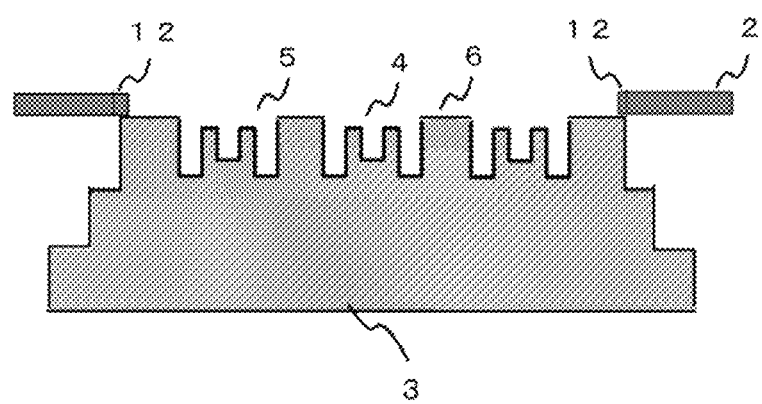
FIG. 13 is a schematic view showing the fin base covered by a panel with protruding portions.

In a case of a panel without panel guide grooves, the panel with protruding portions is set and placed on the fin base, at the point of the swaging operation (cf. FIG. 13). Therefore, positioning of the fin base and the panel is difficult. When a panel is set and leans to one side of the fin base, the swarf which is scraped by protruding portions of the panel varies in large quantity. In some cases, a set pressure may not be enough to swaging operate the fin base and panel. A panel may be fixed to the fin base with inclination, if the operation is performed.

Figure 14A:
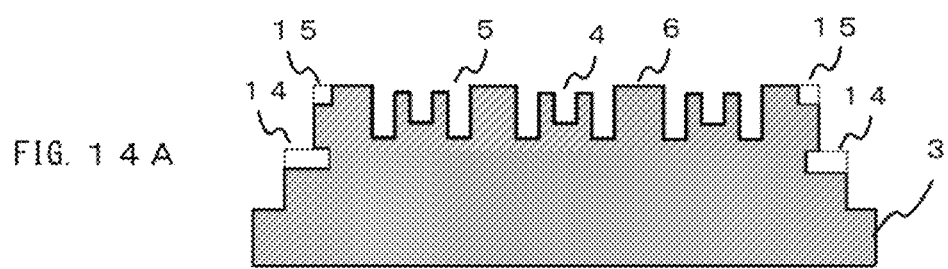
FIGS. 14A to 14C are schematic views representing roles of swarf clearance grooves and panel guide grooves formed in a fin base.
Figure 14B:
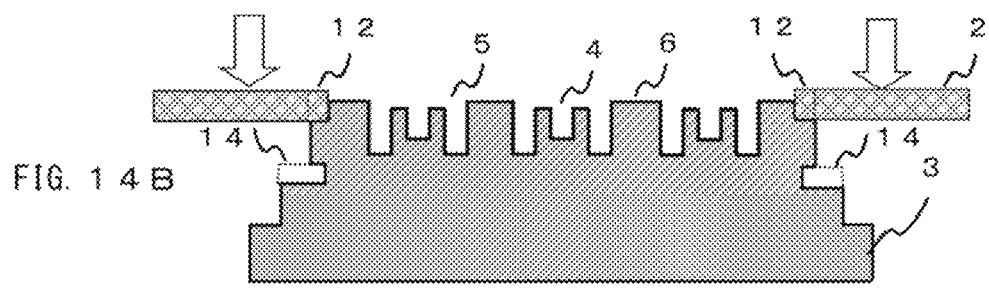
Figure 14C:
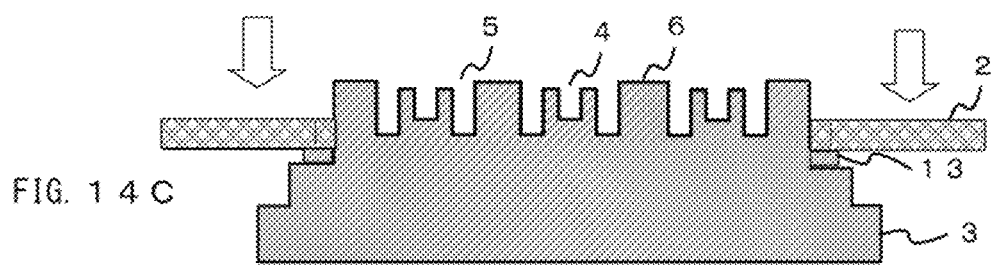

Effects of a swarf clearance groove 14 and a panel guide groove 15 are described below, using FIG. 14 (FIG. 14A to FIG. 14C). As shown in FIG. 14A, the swarf clearance groove 14 and the panel guide groove 15 are formed to fin base 3. At first, as shown in FIG. 14B, a protruding portion 12 of the panel is engaged with the panel guide groove 15. Then, as shown in FIG. 14C, the panel 2 is press fitted to the fin base 3. Cutting debris 13, which are produced from the convex wall portion 6, are contained in the swarf clearance groove 14. Thus, by providing a swarf clearance groove 14 and a panel guide groove 15, the panel is set to a fin base horizontally before swaging operation. Also, the positioning of the panel and the fin base is simplified and the productivity is improved. In a case of a panel without a swarf clearance groove 14 and a panel guide groove 15 and in a case of a panel with a swarf clearance groove 14 and a panel guide groove 15, the vibration resistance and electrical resistance were good and remained the same.

Embodiment 5

Figure 15:
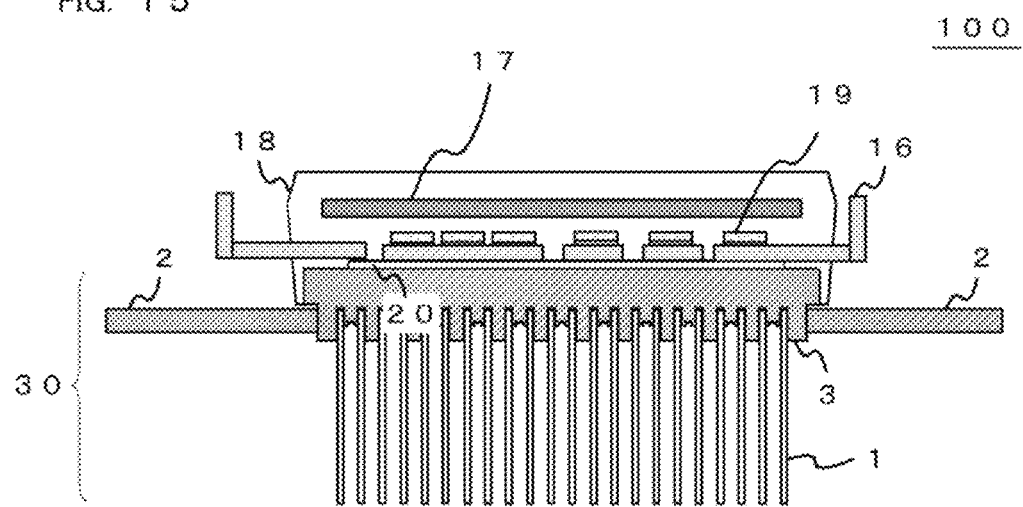
FIG. 15 is a sectional view showing a whole constitution of a heat sink integrated power module, according to Embodiment 5 of the present invention.

FIG. 15 shows a heat sink integrated power module 100 in accordance with the Embodiment 5 of the present invention. The heat sink integrated power module 100 includes a control board 17. A power semiconductor element 19 is joined to a lead frame 16. The lead frame 16 is adhered to the fin base 3 through an insulation sheet 20. An external signal is input into the control board 17 and controls a plurality of power semiconductor elements 19. Herein, the power module, in which a control board 17 is sealed with a mold resin 18 as a whole, is exemplary shown. Other power modules, with similar construction, will constitute a heat sink integrated power module with a high heat dissipating performance and rigidity.

Embodiment 6

Figure 16:
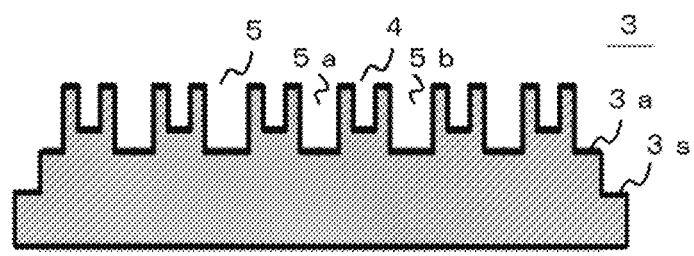
FIG. 16 is a sectional view showing a structure of a fin base, according to Embodiment 6 of the present invention.

An explanation for the constitution of a swaged heat sink in accordance with the Embodiment 6 is given below based on FIG. 16. The fin base 3 according to Embodiment 6 has no convex wall portion between a swage portion and a swage portion. As for the swaged heat sink, the swage portion 4 of a bi-forked shape is deformed to both sides, left and right. Fins are swaging operated from the both sides with the swage portion and are fixed to the fin bae. A first fin insert groove 5a and a second fin insert groove 5b are formed to the fin base 3, with the swage portion 4 having a bi-forked shape in between. A panel is placed on the outer periphery 3a (a first outer periphery). The outer periphery 3a is disposed inner than the outer periphery 3s (a second outer periphery). The thickness of the outer periphery 3a is larger than that of the outer periphery 3s and smaller than the thickness of swage portion 4.

When SiC is employed for the semiconductor elements, in order to take advantage of its characteristic, the semiconductor device is operated at a higher temperature comparing with that equipped with Si elements. For a semiconductor device equipped with SiC elements, higher reliability is demanded as a semiconductor device. Accordingly, a merit of the present invention that is to realize a semiconductor device of high reliability becomes more effective.

Note that each embodiment of the present invention may be freely combined and/or appropriately modified and/or omitted within the scope and spirit of the invention.

NUMERAL REFERENCE

1: fin, 1a: first fin, 1b: second fin, 2: panel,
2a: opening portion, 2b: vent hole, 3: fin base, 3a: outer periphery,
3s: outer periphery, 3p: power module installation face, 3f: fin side face,
4: swage portion, 5: fin insert groove, 5a: first fin insert groove,
5b: second fin insert groove, 6: convex wall portion, 7: flow velocity vector,
8: heating portion, 9: screw, 10: fastening member, 12: protruding portion,
13: cutting debris, 14: swarf clearance groove, 15: panel guide groove,
16: lead frame, 17: control board, 18: mold resin, 19: power semiconductor elements,
20: insulation sheet, 21: jig, 30: swaged heat sink,
40: power module portion,
100: heat sink integrated power module.

The invention claimed is:

1. A swaged heat sink comprising:
a fin base having an outer periphery, formed with a first fin insert groove and a second fin insert groove interposing a swage portion in between, and convex wall portions facing each other and interposing the swage portion in between, the outer periphery having a surface surrounding the first and second fin insert grooves, the swage portion and the convex wall portions in plan view,
a first fin fixed to the first fin insert groove of the fin base using the swage portion,
a second fin fixed to the second fin insert groove of the fin base using the swage portion,
a panel having a through-opening portion, the panel placed on the outer periphery of the fin base,
wherein a thickness of the outer periphery is smaller than a thickness of the fin base, and
the first fin and the second fin are larger than the fin base in length of a ventilation direction and are larger than the through-opening portion in length of the ventilation direction,
a protruding portion is formed in the through-opening portion of the panel, and
the surface of the outer periphery has a pre-formed swarf clearance groove in a position corresponding to the protruding portion of the panel.

2. The swaged heat sink according to claim 1, wherein an outermost convex wall portion has a pre-formed panel guide groove formed in a position corresponding to the protruding portion of the panel.

3. A heat sink integrated power module comprising:
the swaged heat sink according to claim 2;
a power semiconductor element; and
a mold resin body sealing the power semiconductor element.

4. The swaged heat sink according to claim 1,
wherein a thickness of the panel is larger than a difference in thickness between the surface of the outer periphery and a bottom of the first fin insert groove.

5. The swaged heat sink according to claim 1,
wherein the outer periphery has a first outer periphery and a second outer periphery of different thicknesses, the panel is placed on the first outer periphery, the first outer periphery is disposed at an inner side of the second outer periphery, and the thickness of the first outer periphery is larger than the thickness of the second outer periphery and smaller than the thickness of the swage portion.

6. The swaged heat sink according to claim 5,
wherein a thickness of the panel is larger than a difference in thickness between the first outer periphery and the first fin insert groove.

7. A heat sink integrated power module comprising:
the swaged heat sink according to claim 5;
a power semiconductor element; and
a mold resin body sealing the power semiconductor element.

8. A heat sink integrated power module comprising:
the swaged heat sink according to claim 1;
a power semiconductor element; and
a mold resin body sealing the power semiconductor element.

9. The swaged heat sink according to claim 1,
wherein the panel is interposed between the outer periphery of the fin base and the first fin and the second fin.

10. The swaged heat sink according to claim 1,
wherein a length of the panel in the ventilation direction is larger than a length of the first fin in the ventilation direction.

11. The swaged heat sink according to claim 1,
wherein a length of the panel in the ventilation direction is larger than a length of the first fin and a length of the second fin in the ventilation direction.

12. A swaged heat sink comprising:
a fin base having an outer periphery, formed with a first fin insert groove and a second fin insert groove interposing a swage portion in between, and convex wall portions facing each other and interposing the swage portion in between, the outer periphery having a surface surrounding the first and second fin insert grooves, the swage portion and the convex wall portions in plan view,
a first fin fixed to the first fin insert groove of the fin base using the swage portion,
a second fin fixed to the second fin insert groove of the fin base using the swage portion,
a panel having a through-opening portion, the panel placed on the outer periphery of the fin base,
wherein a thickness of the outer periphery is smaller than a thickness of the fin base,
the first fin and the second fin are larger than the fin base in length of a ventilation direction and are larger than the through-opening portion in length of the ventilation direction,
a protruding portion is formed in the through-opening portion of the panel, and
an outermost convex wall portion has a pre-formed panel guide groove in a position corresponding to the protruding portion of the panel.

13. The swaged heat sink according to claim 12,
wherein a thickness of the panel is larger than a difference in thickness between the outer periphery and the first fin insert groove.

14. The swaged heat sink according to claim 12,
wherein the outer periphery has a first outer periphery and a second outer periphery of different thicknesses,
the panel is placed on the first outer periphery,
the first outer periphery is disposed at an inner side of the second outer periphery, and
the thickness of the first outer periphery is larger than the thickness of the second outer periphery and smaller than the thickness of the swage portion.

15. The swaged heat sink according to claim 14,
wherein a thickness of the panel is larger than a difference in thickness between the first outer periphery and the first fin insert groove.

16. A heat sink integrated power module comprising:
the swaged heat sink according to claim 14;
a power semiconductor element; and
a mold resin body sealing the power semiconductor element.

17. A heat sink integrated power module comprising:
the swaged heat sink according to claim 12;
a power semiconductor element; and
a mold resin body sealing the power semiconductor element.

18. The swaged heat sink according to claim 12,
wherein the panel is interposed between the outer periphery of the fin base and the first fin and the second fin.

19. The swaged heat sink according to claim 12,
wherein a length of the panel in the ventilation direction is larger than a length of the fin base in the ventilation direction.

20. The swaged heat sink according to claim 12,
wherein a length of the panel in the ventilation direction is larger than a length of the first fin and a length of the second fin in the ventilation direction.

* * * * *